US007010270B1

(12) United States Patent
Thomas et al.

(10) Patent No.: US 7,010,270 B1
(45) Date of Patent: Mar. 7, 2006

(54) PARALLEL OPERATION OF DEVICES USING MULTIPLE COMMUNICATION STANDARDS

(75) Inventors: Harald Thomas, Nürnberg (DE); Walter Kodim, Nürnberg (DE); Roman Glockler, Lauf (DE); Herbert Dingfelder, Schwabach (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 464 days.

(21) Appl. No.: 09/637,543

(22) Filed: Aug. 11, 2000

(30) Foreign Application Priority Data

Aug. 24, 1999 (EP) .................................. 99116576

(51) Int. Cl.
*H04B 17/00* (2006.01)
(52) U.S. Cl. .................................. 455/67.13; 455/552.1
(58) Field of Classification Search ................ 455/552, 455/553, 406, 550, 78, 250.1, 295, 296, 136, 455/574, 68, 69, 245.1, 343, 114.2, 311, 341, 455/552.1, 553.1; 342/357.06, 357.1
See application file for complete search history.

(56) References Cited

U.S. PATENT DOCUMENTS

| | | | | |
|---|---|---|---|---|
| 5,815,821 A | | 9/1998 | Pettersson | .................. 455/575 |
| 6,111,540 A | * | 8/2000 | Krasner | .................. 342/357.1 |
| 6,134,427 A | * | 10/2000 | Hughes | .................. 455/269 |
| 6,311,048 B1 | * | 10/2001 | Loke | .................. 455/245.1 |
| 6,442,375 B1 | * | 8/2002 | Parmentier | .................. 455/78 |

FOREIGN PATENT DOCUMENTS

WO      WO 99/36795      * 7/1999

OTHER PUBLICATIONS

Tietze, Ulrich Dr.-Ing et al. "Halbleiter-Schaltungstechnik". Springer Verlag. ISBN 3-540-16720-X. pp. 49-54.

* cited by examiner

*Primary Examiner*—Nay Maung
*Assistant Examiner*—Tu X. Nguyen

(57) ABSTRACT

To maintain a receiving sub-system in a multiple standard communication device fully operational according to all operation modes of a second transmitting sub-system of the multiple communication device it is proposed that a multiple standard communication device of the type with parallel operation comprises a first subunit at least receiving input signals at a predetermined input level, and a second subunit at least transmitting output signals at a specific time, frequency and output level such that the output level is very large compared to the input level of the first subunit. According to the present invention the operation mode of the first subunit is modified when the second subunit is transmitting output signals.

33 Claims, 14 Drawing Sheets

FIG.14
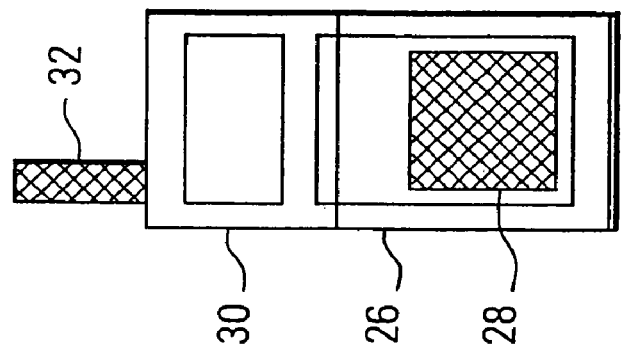
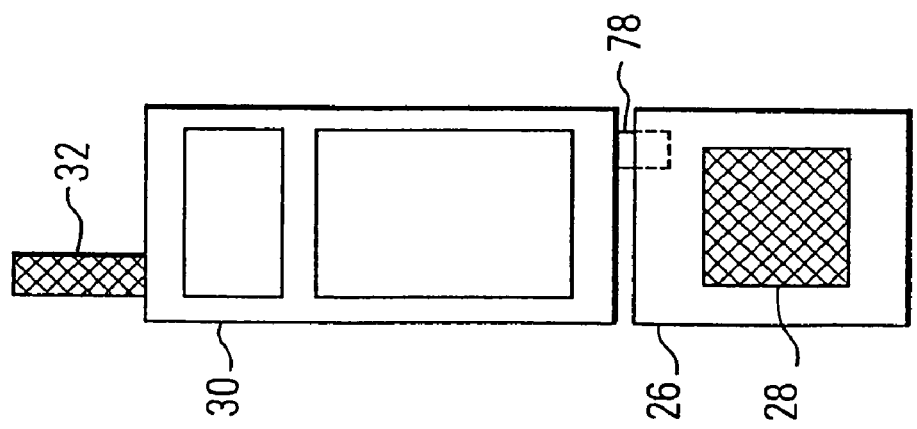

PARALLEL OPERATION OF DEVICES USING MULTIPLE COMMUNICATION STANDARDS

FIELD OF INVENTION

The present invention relates to the parallel operation of multiple devices using multiple communication standards, and in particular to the parallel operation of multiple communication units receiving/transmitting signals at different power levels.

BACKGROUND ART

Smart combinations of different communication units, e.g., cellular mobile phones and Global Positioning System (GPS) receivers are getting more and more important since an increased number of position dependent applications (like route guiding applications, telematics running almost anywhere at any time etc.) are spreading rapidly in the market place.

One such example is a direct sampling receiver for a global positioning system that corresponds to the use of a pair of amplification and comparison units for amplifying an RF-signal received through related antennas in a diversity apparatus for a global positioning system. In the global positioning system one of the switching units is selected in response to outputs from amplification in comparison units such that the signal from the selected switching unit having the best sensitivity amongst a number of transceiver systems is selected.

FIG. 1 shows a schematic diagram for such a multiple standard communication device 100. Typically, the multiple standard communication device comprises at least two subunits 102 and 104 each having a separate antenna 106 and 108, respectively. Examples for such a multiple communication device are the adaption of a GPS receiver unit to a cellular mobile phone unit or the combination of two mobile phone units according to two different standards.

However, if the subunits are integrated in a multiple standard communication device, e.g., through attaching the subunits with a dedicated connector or even by building the first subunit into the housing of the second subunit problems arise due to the decreased distance between both functional units.

Further, in the sense of the present invention there exists no restriction to any specific combination of two or more subunits as long as a plurality of communcation standards are integrated into the multiple standard communication device. Thus, possible combinations could be any pair of subunits adapted to standards taken from a group consisting of GSM900, GSM1800, GSM1900, GPS, AMPS, PDC, CDMA, WCDMA, DAMPS, or positioning system standards GPS, Glonass, EGNOS, WAAS, etc.

As shown in FIG. 1, in a multiple communication device there arises the operation condition that a first subunit 102 adapted to GPS is receiving a signal while a second subunit 104 adapted to GSM is transmitting a signal. Here, in case the first subunit 102 is operating very next to the second subunit 104 the proper operation of both subunits may be prevented since large transmitter output signals from the GSM unit may degrade the reception performance, e.g., the receiver sensitivity in the GPS unit 102.

In particular this is the case if the transmission signal level at the second subunit 104 and the reception signal level at the first subunit 102 differ significantly. E.g., GPS signals are transmitted via satellites and the reception level is lying several 10 dB below, e.g., the GSM transmission level.

Therefore, to increase the receiver sensitivity there is carried out a reception signal averaging or equivalently correlation in the related subunit 102 to increase reception sensitivity. The longer the time spent for reception signal averaging the higher the sensitiviy gain will be.

However, the output of transmission signals by the second subunit 104—e.g., in a burst mode according to digital TDMA in GSM—may prevent the proper operation of the first subunit 102 since the generation of transmission signals at the antenna 108 with signal levels much higher than the reception signals at the antenna 106 may degrade the reception performance, e.g., the receiver sensitivity at the first transceiver subunit 102.

In the following a more detailed description of problems underlying the present invention will be given with respect to a multiple standard communication device where a second subunit is adapted to the GSM mobile communication standard and a first subunit is a GPS receiver for location specific services.

As will be easily understood by a person skilled in the art the problems discussed are not specific to the GSM/GPS combination but can occur as well in any other multiple standard communication device. Also, the standards underlying the GSM mobile communication system and the GPS localization system relate to technological background of the present invention and are not described in further detail here.

The GSM system being based on the digital TDMA/FDMA transmission technology is using, e.g., one out of eight time slots for the transmission of signals unless multislot operation is activated. Therefore, in case of co-operating of such a GSM transceiver subunit and such a GPS receiver subunit in a multiple standard communication device the GPS receiver subunit sensitivity is degraded by a factor of ⅛ or equivalently 9 dB during transmission by the GSM transceiver subunit.

This value increases when more than one time slot per frame is used for transmission.

Further, the synchronization of the GPS receiver subunit to the satellite may be lost during a long lasting data or voice transmitter signal outputted by the GSM transceiver subunit.

Still further, it may be difficult to maintain GPS receiver subunit functionality in case of emergency at any time during operation thereof.

In addition, as shown in FIG. 2 illustrating the input/output behaviour of a low noise amplifier increased interfering input signals create undesired mixing signal products and thus degrade the overall noise figure and gain of the low noise amplifier which may no longer be considered as linear device.

A parameter describing the ability to handle increased input signals and shown in FIG. 2 is the 1 dB compression point and defined as the output power level at which the gain drops by 1 dB. Typically, the noise figure and the 1 dB compression point of a low noise amplifier strongly depend on the biasing condition of the amplication element—e.g., a transistor.

Also, it is important to note that a low noise figure found at a low amplification element current usually does not correspond to a high 1 dB compression point and vice versa. This is important for battery powered transceiver subunits where a very low current consumtion is needed to achieve a sufficiently long operation/standby time. In other words, this means that the reduction of the amplification element operative current—e.g., the collector current of an amplifying transistor—per se does not lead to an improved blocking behaviour but that further steps are necessary to achieve a satisfying parallel operation of different subunits in a multiple communication device.

In view of the above, further details with respect to the multiple standard communication device adapted to the GSM mobile communication standard and having a GPS receiver for location specific services will now be discussed by way of measurement data shown in FIGS. 3 to 5.

A GPS receiver subunit must pick up very weak localization signals from a noise background. Here, the minimum received power in the L1 band for the CA code is about −160 dBW when the space satellite transmitting the signal is at two elevation angles of 5° from the user's horizon and zenith. Between these two elevation angles the minimum reveived power levels gradually increase up to 2 dB maximum, see Understanding GPS Principles and Applications, E. D. Kaplan, Artech House, 1996.

On the other hand at the same time the GPS receiver subunit is to reject a large number of much stronger unwanted signals. As already outlined above, a low noise amplifier in a GPS receiver subunit must handle interferring transmission bursts generated by the GSM transceiver subunit. The GSM 900 subunit generates a maximum output power in the range of 33 dBm and the maximum output power of the GSM 1800 and 1900 transceiver subunit is 30 dBm.

Further, the actual interferring input power according to the GSM transmission burst signal input at the GPS antenna and supplied to the low noise amplifier of the GPS receiver subunit strongly depends on the relative position of the GPS antenna to the GSM antenna.

The low noise amplifier in the GPS receiver subunit used for the measurements shown in FIGS. 3 to 5 uses a transistor of the BFP405 type as amplification element having a noise figure and power gain at different bias operations points at 1.6 GHz as listed in the following table:

| Ic [mA] | $|S21| * |S21|$ [dB] (Power gain) (VCE = 1 V, f = 1.6 GHz) | Fmin [dB] (Noise figure) |
| --- | --- | --- |
| 1.0 | 10.7 | 0.97 |
| 1.5 | 13.5 | 0.97 |
| 2.0 | 15.3 | 1.01 |
| 2.5 | 16.7 | 1.07 |
| 3.0 | 17.7 | 1.13 |
| 4.0 | 19.0 | 1.22 |
| 5.0 | 19.9 | 1.33 |
| 6.0 | 20.6 | 1.42 |
| 8.0 | 21.3 | 1.58 |
| 10.0 | 21.8 | 1.72 |

The impact of different bias operation points or equivalently of different collector currents Ic on the overall GPS receiver subunit will be discussed in the following.

FIG. 3 shows a low noise amplifier gain versus input signal representation in the presence of an interfering signal at 900 MHz for a low noise amplifier used in the GPS receiver subunit. From FIG. 3 it may be seen that a low noise amplifier gain compression starts at interferer levels in the range of −30 dBm to −25 dBm, depending on the collector current Ic.

Further FIG. 4 shows a noise figure of the low noise amplifier in the GPS receiver subunit in the presence of an interfering signal at 900 MHz. As shown in FIG. 4 the noise figure of the low noise amplifier deteriorates with increasing interferer level according to approximately the same rate for each collector current Ic 1.5 mA, 2.5 mA, and 4 mA, respectively.

Further, FIG. 4 shows a moderate increase in noise figure for interference levels up to −20 dBm and an increased interference level according to a factor of approximately 3 for an interference level of −10 dBm. While the illustrated results have been captured at 900 MHz the same results are to be expected for interfering signals at 1800 MHz and 1900 MHz, respectively.

Further, FIG. 5 shows the impact of a variation of noise figure and gain of the low noise amplifier of the GPS receiver subunit on the total noise figure and gain of the GPS receiver subunit. Here, the assumptions underlying the calculation of the overall noise figure are as follows: G=−3 dB, NF=3 dB for the filter of the bandpass type, G=39 dB, NF=7 dB for the amplifier and mixer gain, and gain and noise figures are assumed to be constant.

As shown in FIG. 5 the overall noise figure of the GPS receiver subunit increases generally with decreasing gain of the low noise amplifier comprised therein and with an increasing noise figure of the low noise amplifier of the GPS receiver subunit itself. Thus, to optimize performance at the GPS receiver subunit it would be necessary to maximize the gain of the low noise amplifier and minimize the related noise figure.

Heretofore it has been proposed to employ, e.g., means for filtering at the input of the low noise amplifier of the GPS receiver subunit in order to reject strong out-of-band input signals to the low noise amplifier and thus to reduce gain compression. Another option would be to increase the collector current Ic of the transistor realizing the amplification element of the low noise amplifier. However, additional filtering in front of the low noise amplifier increases the overall noise figure of the GPS receiver subunit due to the losses in the filter. Further, collector currents kept on constanly high levels are not desireable for battery powered transceiver subunits due to the decreased operation time.

While in the above a specific configuration with respect to a GPS/GSM multiple standard communication device has been described it is to be understood that any other combination where signal levels for transmission/receptions levels differ significantly between different subunits in a multiple standard communication device lead to identical technical difficulties and performance degradations.

SUMMARY OF INVENTION

In view of the above, the problem of the invention is to maintain a first receiving sub-system in a multiple standard communication device fully operational for all operation modes of a second transmitting sub-system in the multiple communcation standard device.

According to the present invention this object is achieved through a multiple standard communication device having the features of claim 1.

Thus, according to the present invention it is proposed to implement at least one of the subunits in the multiple standard communication device such that the operation mode thereof may be modified and switched in dependence of the transmission operation mode of the at least one other subunit in the multiple standard communication device.

Therefore, the present invention solves problems with respect to limited receiver performance in a first subunit during transmission of signals by a second subunit.

In particular a first receiving mode of the first subunit is dedicated to an optimum noise performance of that first subunit and a related low current consumption whereas a second receiving mode is used to increase blocking performance in case the second subunit generates transmission signals with signal levels much higher than the signal levels to be expected at the first subunit antenna.

According to a preferred embodiment of the present invention the first subunit comprises an operation mode modification unit to receive at least one signal specifying time, frequency and/or output level of the second transceiver for operation mode modification in the first subunit.

According to yet another preferred embodiment of the present invention the operation mode modification unit is adapted to modify the input characteristic of the first subunit for operation mode modification in the first subunit, preferably through modification of a low noise amplifier having at least two operation modes and/or a tunable filter and/or a switchable receiver and/or an antenna with tunable gain.

Therefore taking either approach for the modification of the operation mode in the first subunit it is possible to enhance the overall blocking performance at the first subunit when the second subunit is outputting transmitting signals.

According to a preferred embodiment of the present invention different operation modes in the first subunit are realized using the low noise amplifier that comprises a switchable bias network adapted to define at least two biasing conditions of the low noise amplifier and a switchable matching network adapted to optimize noise performance, gain and stability of the low noise amplifier for the at least two biasing conditions. A first biasing condition is related to a normal operation mode to optimize noise performance and achieve low current consumption in the first subunit when no transmit bursts are generated by the second subunit. Further, a second biasing condition is related to a gain adjustment mode to improve blocking performance when transmit bursts are generated by the second subunit. Preferably, the switchable matching network is adapted to define the at least two biasing conditions for an transistor realizing an amplification element of the low noise amplifier.

Therefore, according to this preferred embodiment it is possible to achieve low current and optimum noise performance when the second subunit is not generating transmission signals, e.g., transmission bursts according to the TDMA transmission scheme, or in other words to achieve best reception performance at the first subunit.

Thus, the first subunit remains fully operational when the second subunit is transmitting signals and the related low noise amplifier gain in the first subunit is not degraded significantly.

Overall the noise performance of the low noise amplifier in the first subunit is optimized for at least two bias operation points thereof and a cost effective solution may be achieved since no additional filter structures in front of the low noise amplifier are needed.

According to a preferred embodiment the operation mode modification unit employs at least one signal to activate the transmission operation mode in the second subunit.

Also, control and/or input signals defining the transmitter signal in the second subunit are employed to activate the gain adjustment mode in the first subunit during parallel operation of both subunits in the multiple standard communication device.

Therefore, according to the present invention signals being available anyway during the operation of the multiple standard communication device are used to set the different operation modes in the first subunit. Thus additional measures to identify different operation modes and optimize related settings in the multiple standard communication device are minimized.

According to yet another preferred embodiment of the present invention the switchable receiver comprises a first low noise amplifier being directly connected to an antenna adapted to receive a signal for localization, and to amplify the signal for localization, a second low noise amplifier adapted to amplify the signal for localization, and a filter connected between the antenna and the second low noise amplifier and adapted to reject blocking signals. In case the performance of the first low noise amplifier is limited to an interfering signal the second low noise amplifier with the filter connected thereto is activated.

Therefore, according to this preferred embodiment no tunable filters are required with the receiver architecture having two different low noise amplifiers. Here, a first low noise amplifier is connected directly to an antenna whereas a second low noise amplifier is connected through a filter to an antenna. Whenever performance of the directly connected low noise amplifier is restricted during transmission of a signal by the second subunit the second low noise amplifier having the blocking filter at its input terminal is activated in order to maintain adaquate reception quality.

According to yet another preferred embodiment of the present invention the antenna characteristics of the subunit are adapted to enhance blocking performance of the first subunit for shifting the frequency with maximum gain in case of presence of a transmission signal outputted by the second subunit.

This tuning allows to provide additional attenuation for out of band signals in a simple and cost efficient manner. Also, it may either be used as a single measure or in combination with the preferred embodiments of the present invention outlined above.

BRIEF DESCRIPTION OF DRAWINGS

In the following preferred embodiments of the present invention will be described with reference to the drawing in which

FIG. 14 shows an illustration of a GPS/GSM multiple communication device according to the present invention.

DESCRIPTION OF PREFERRED EMBODIMENTS

As outlined above, the different embodiments of multiple standard communication device 10 according to the present invention shown in FIG. 7 and to be described in the following aim at keeping a first, at least receiving subunit 12 of the multiple communication device 10 fully operational for all operation modes of a second, at least transmitting subunit 14 of the multiple communication device.

Figure 1:
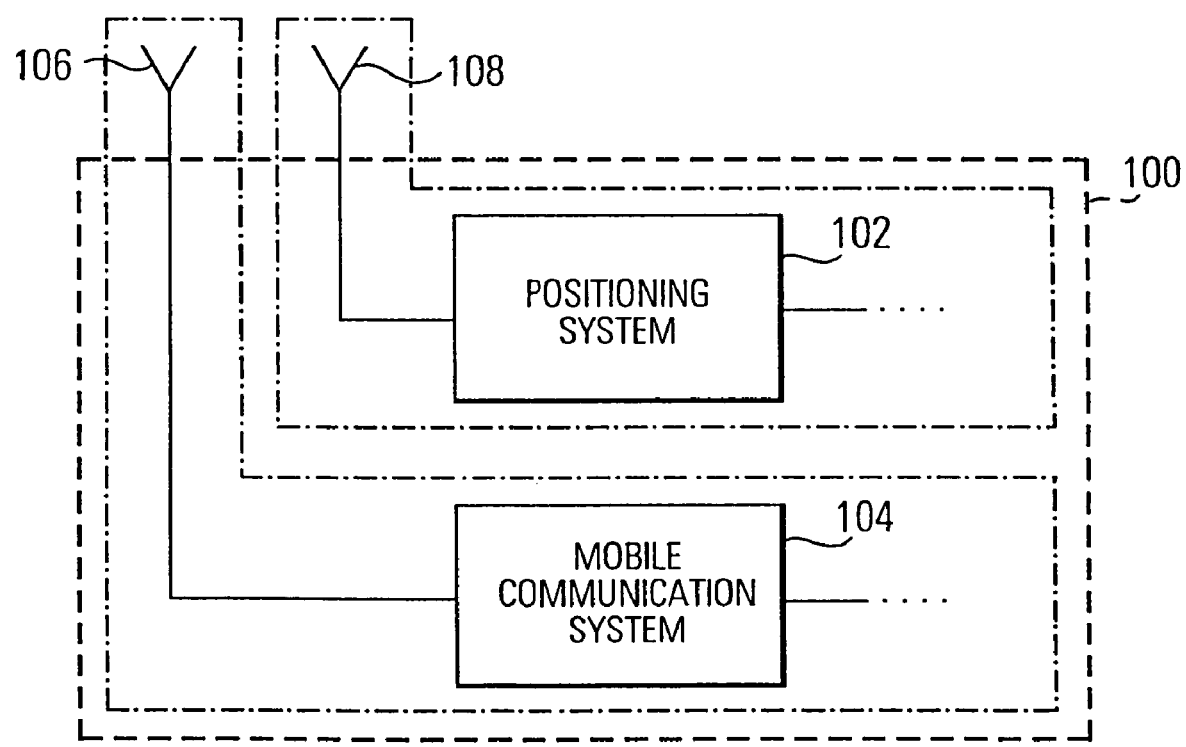
FIG. 1 shows a schematic diagram for a multiple standard communication device according to the background art of the present invention.
Figure 2:
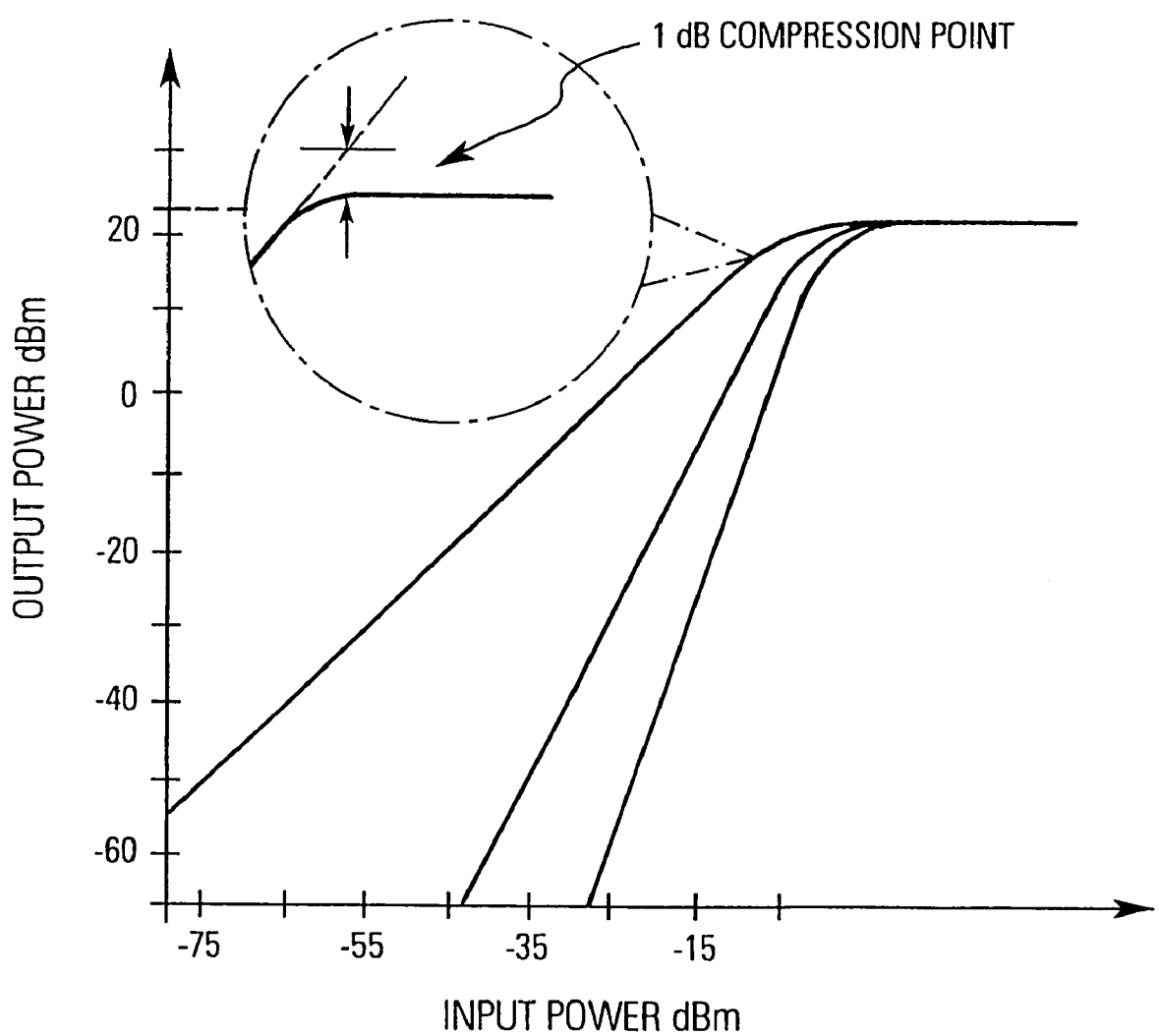
FIG. 2 shows the amplification characteristics of a low noise amplifier and the impact of an interferring input signal therefor.
Figure 3:
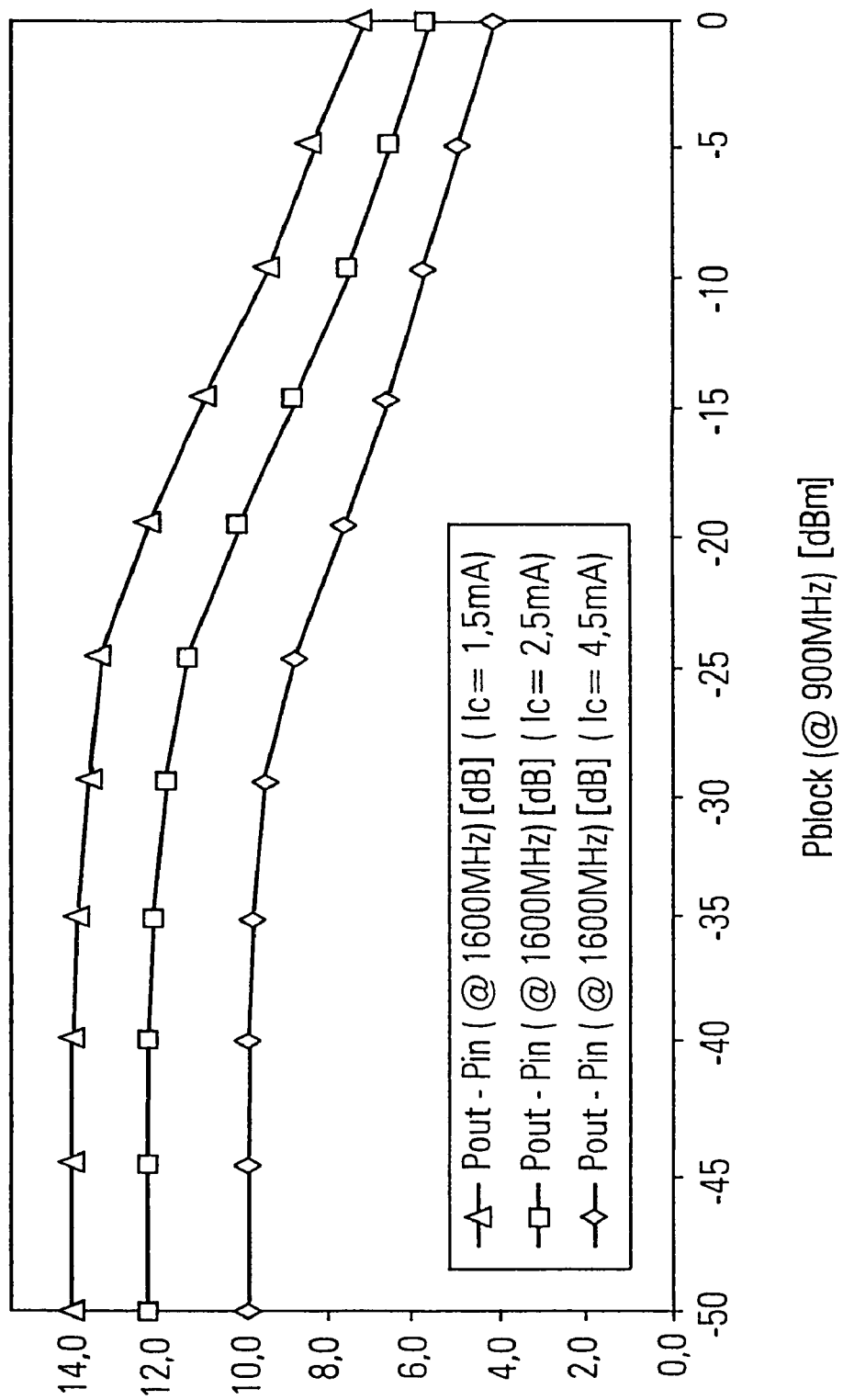
FIG. 3 shows a amplifier gain versus input signal representation in the presence of an interfering signal for a low noise amplifier that may, e.g., be used in a position system GPS receiver subunit.
Figure 4:
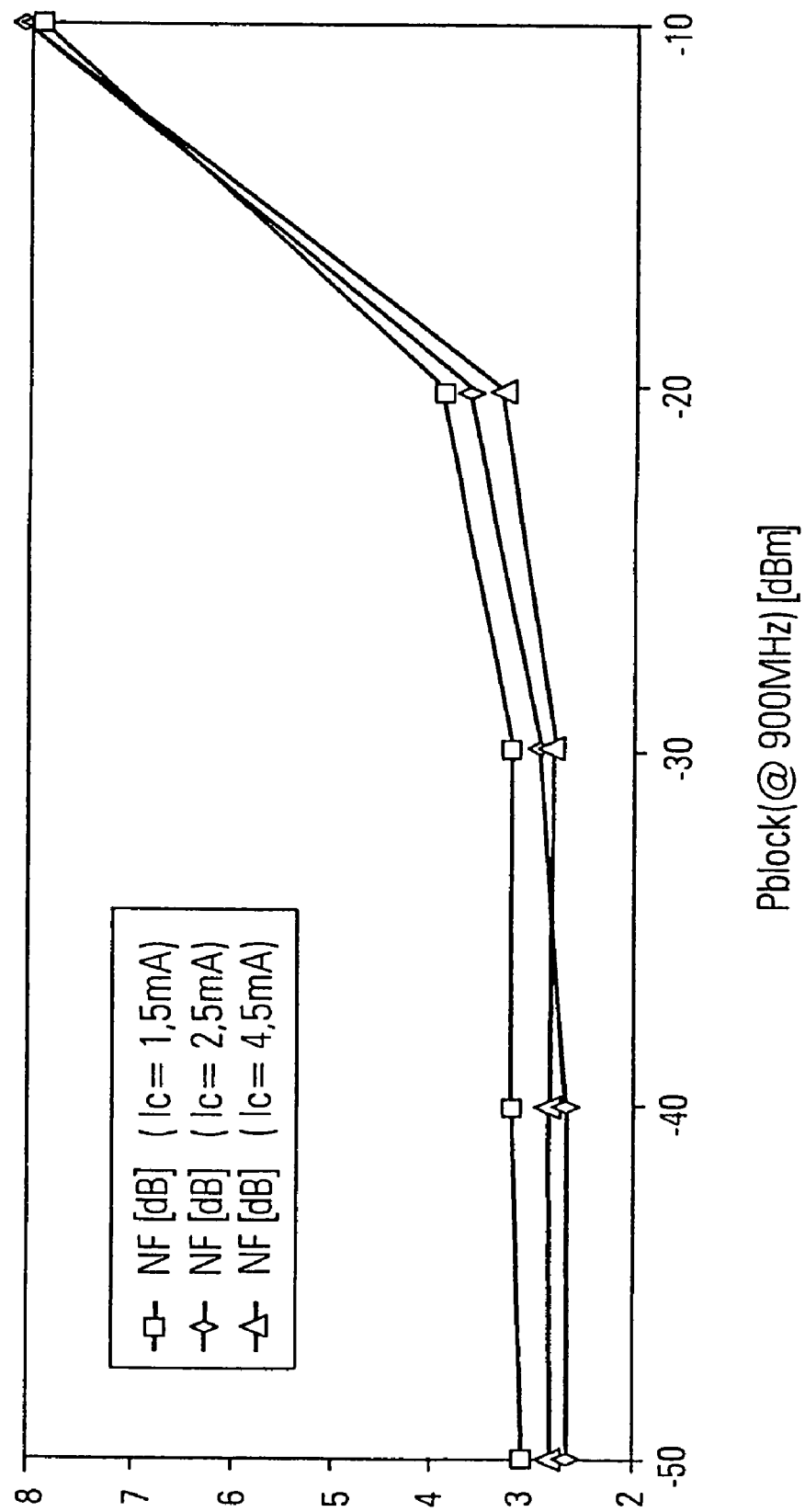
FIG. 4 shows a noise figure of the low noise amplifier in the GPS receiver subunit in the presence of an interfering signal.
Figure 5:
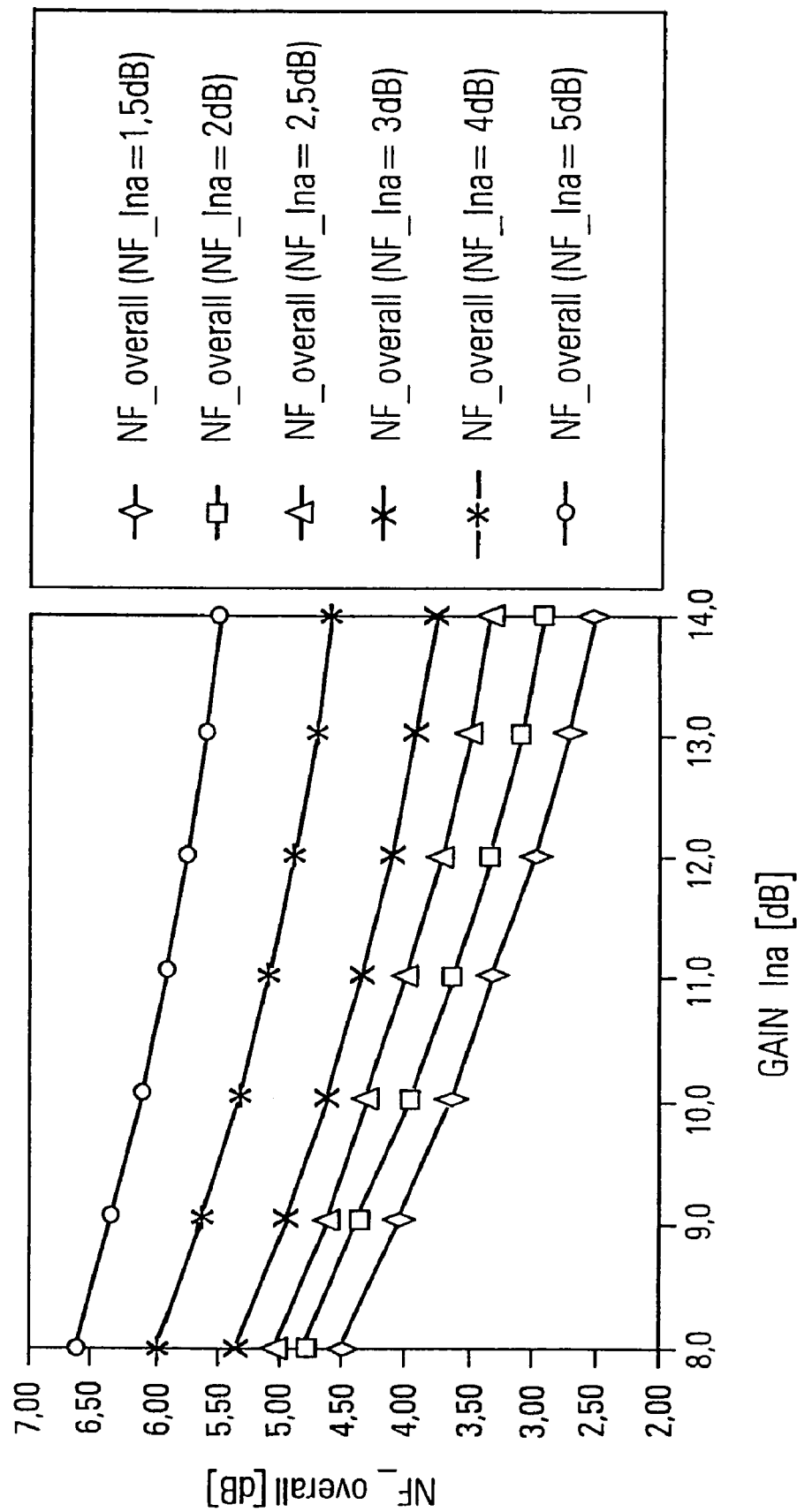
FIG. 5 shows the impact of a variation of noise figure and gain of the low noise amplifier of the GPS receiver subunit on the total noise figure and gain of the GPS receiver subunit.
Figure 6:
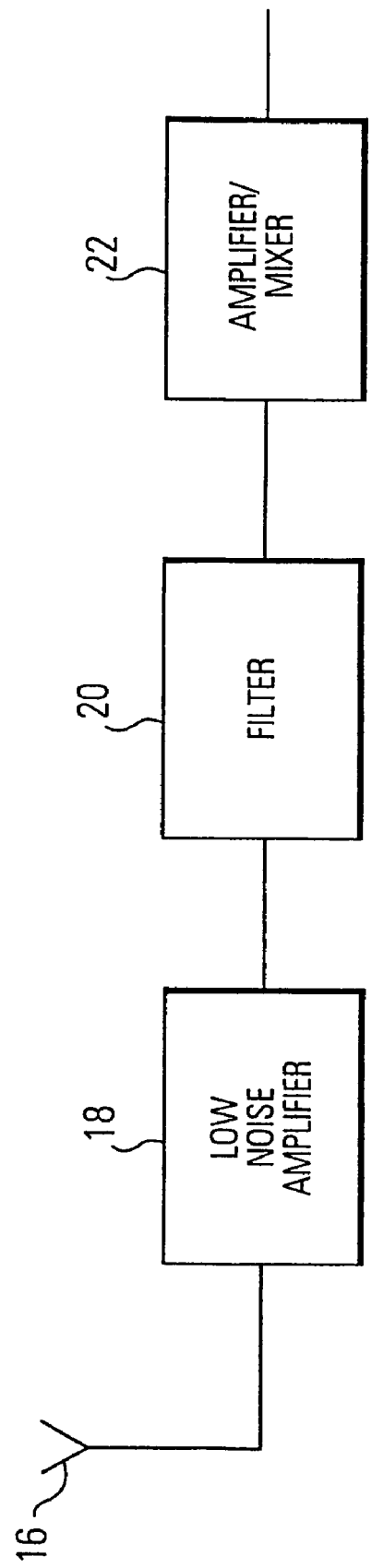
FIG. 6 shows a basic schematic diagram at first elements of each subunit in the multiple communication device.

FIG. 6 shows an example of a basic schematic diagram for each subunit in the multiple standard communication device 10 handling transmitter/receiver signals between an antenna and an intermediate IF stage.

As shown in FIG. 6, each subunit comprises the antenna 16, a low noise amplifier 18, a filter 20 and an amlipifer/mixer 22. While in FIG. 6 the low noise filter is shown connected to the input of the filter 20 the sequence may as well be reversed.

The different embodiments of the present invention make use of the fact that the overall receiver performance in each sub-system and also the related receiver sensitivity is mainly determined by the performance contributions—e.g., noise figures—of the very first stages in the subunit.

In particular, the noise figure of the low noise amplifier shown in FIG. 6 is one of the main factors for the overall noise figure of the overall subunit in case no pre-filtering is carried out in front of the low noise amplifier.

This may be seen from an analysis of the overall noise figure of each subunit taking into account the cascaded structure thereof and the following parameters:

Fi Noise figure of stage i;
Gi Gain factor of stage i;
Li Stage loss of stage (1/GI);
T Device temperature in K;
TO Room temperature defined to 290 K;
T[K] T[C°]+273,15 K;
Fi[dB] 10*log(Fi); and
Gi[dB] 10*log(Gi).

Using the following formula $$F=F1+(F2-1)/G1+(F3-1)/(G1*G2)+(F4-1)/(G1*G2*G3)+\ldots ==1+\text{sum}(i=1 \text{ to } n)\{Fi-1/\text{mul}(j=1 \text{ to } n-1)(Gi)\}$$

for the calculation of the cascaded noise figure the following results are obtained for the different stages of the subunit shown in FIG. 6:

| Comment | Gain [dB] | Noise figure [dB] |
| --- | --- | --- |
| Low noise amplifier | 8.0 | 2.5 (variable) |
| Filter | −3.0 | 3.0 (fixed) |
| Amplifier & mixer | 39.0 | 7.0 (fixed) |

Overall gain [dB] = 44.0
Overall noise figure [dB] = 5.06

Also the formula given above allows to compare a case A where no interferring signal from the transmitting subunit 14 is received at the receiving subunit 12 in comparison to a case B where such an interferring signal is received the receiving subunit 12:

| Comment | Case A | Case B | Difference A–B |
| --- | --- | --- | --- |
| Low noise amplifier | G [dB] = 12.0<br>NF [dB] = 2.5 | G [dB] = 8.0<br>NF [dB] = 2.5 | 4.0<br>0.0 |
| Transceiver subunit | G [dB] = 48.0<br>NF [dB] = 3.7 | G [dB] = 44.0<br>NF [dB] = 5.1 | 4.0<br>1.4 |

In evaluating the differences of, e.g., several dB between case A and B for the gain G and the noise figure NF it is important to note that for many application—.e.g., the use of GPS localization information in a GSM mobile phone—the received signal level at the first subunit—e.g., adapted to the GPS system standard—is already some several 10 dB below the transmitter signal level of the transmitting second subunit 14—e.g., adapted to the GSM standard. In conclusion, a further reduction of the received signal level at the first subunit 12 may render this subunit fully in-operational.

In the following, there will be described a multiple standard communication device 24 according to the present invention. This multiple standard communication device 24 comprises a first subunit 12 receiving input signals via a first antenna 28 at a predetermined input level. Further, a second subunit 14 transmits output signals via a second antenna 32 at a specific time, frequency and output level. Here, the output level of the second subunit 14 is very large compared to the input level of the first subunit 12.

To avoid the interference of transmission signals of the second subunit 14 at the first subunit 12, according to the present invention it is proposed to modify the operation mode of the first subunit 12 when the second subunit 14 is transmitting output signals.

Heretofore, the first subunit 12 comprises operation mode modification unit 34 to receive at least one signal from the second subunit 14 specifying time, frequency and/or output level in the second subunit 14. This one signal may then be used for operation mode modifications in the first subunit 12. In particular, the operation mode modification unit 34 is adapted to modify the input characteristic of the first subunit 12.

Figure 7:
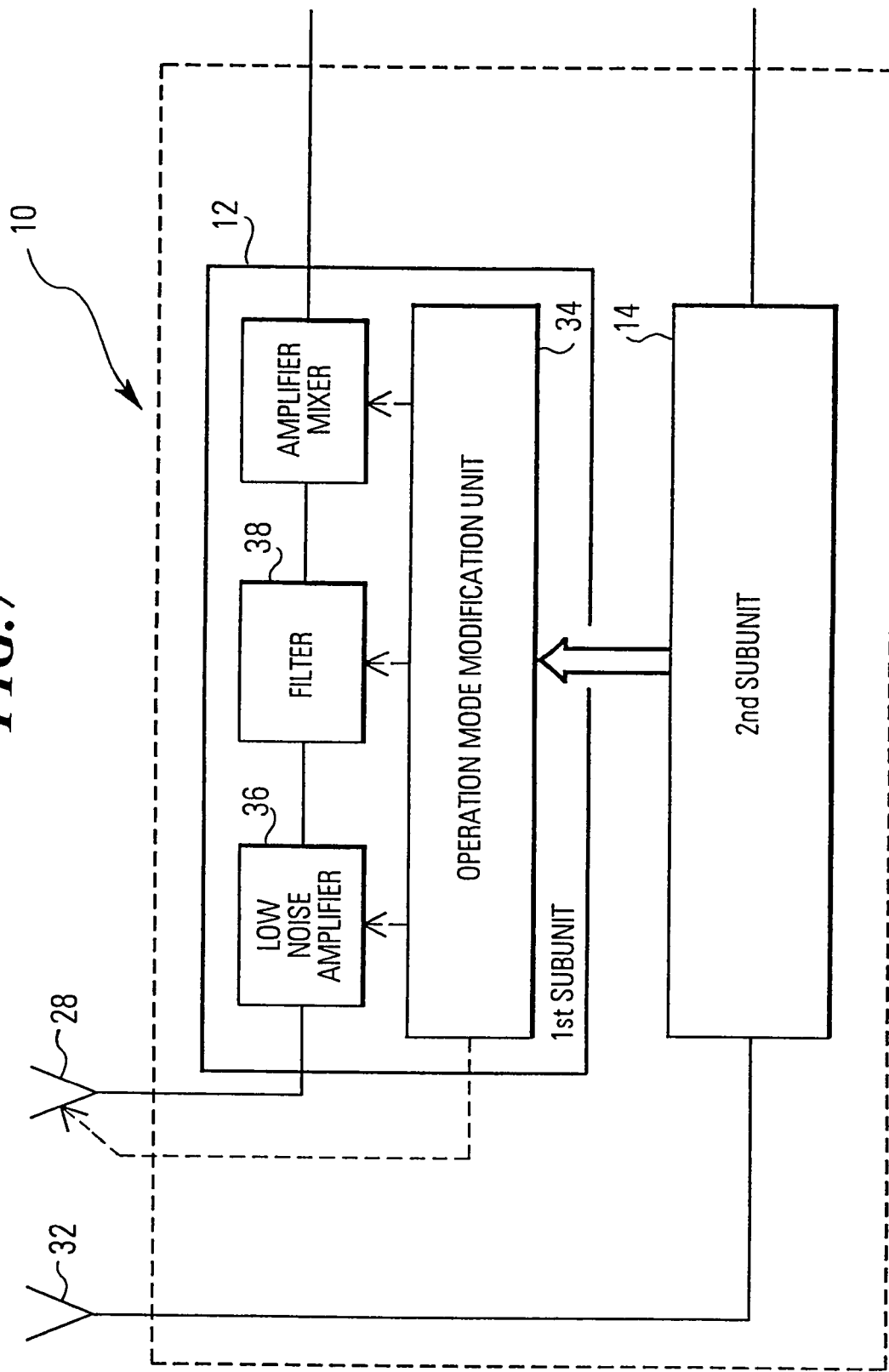
FIG. 7 shows a schematic diagram of a multiple standard communication device according to the present invention.

As further shown in FIG. 7, the operation mode modification unit 34 is particularly adapted to modify at least the input characteristics of a low noise amplifier 36 in the first subunit 12 which has at least two operation modes. Also, the operation mode modification unit may equivalently amend a tunable filter 38 and/or further a switchable receiver 70. Still further, the operation mode modification means may as well be adapted to tune the antenna 28 which may have a variable gain.

The operation mode modification unit 34 shown in FIG. 7 minimizes the impact of gain compression of the overall noise figure of the first subunit 12—e.g., a GPS receiver—by strong interfering signals from the second subunit 14—e.g., a GSM mobile phone—are present at the low noise amplifier input of the first subunit 12 by adjusting the gain of this lower noise amplifier. Here, gain adjustment or equivalently an increased gain occurs every time a strong interfering signal from the second subunit 14 is present at the low noise amplifier of the first subunit 12. This is the case when transmission bursts with high output power are generated in the second subunit 14.

To the contrary, transmission bursts having low output power do not lead to a significant increase in compression and therefore no operation mode amendment is carried out by the operation mode modification unit 34 in this case. Typically, a threshold activating gain adjustment is determined through the design of the first antenna 28 and the second antenna 32, further the low noise amplifier—in particular, the collector current of the amplifying transistor comprised therein, and the type of transmission bursts, i.e. the related frequency and output level.

Figure 8:
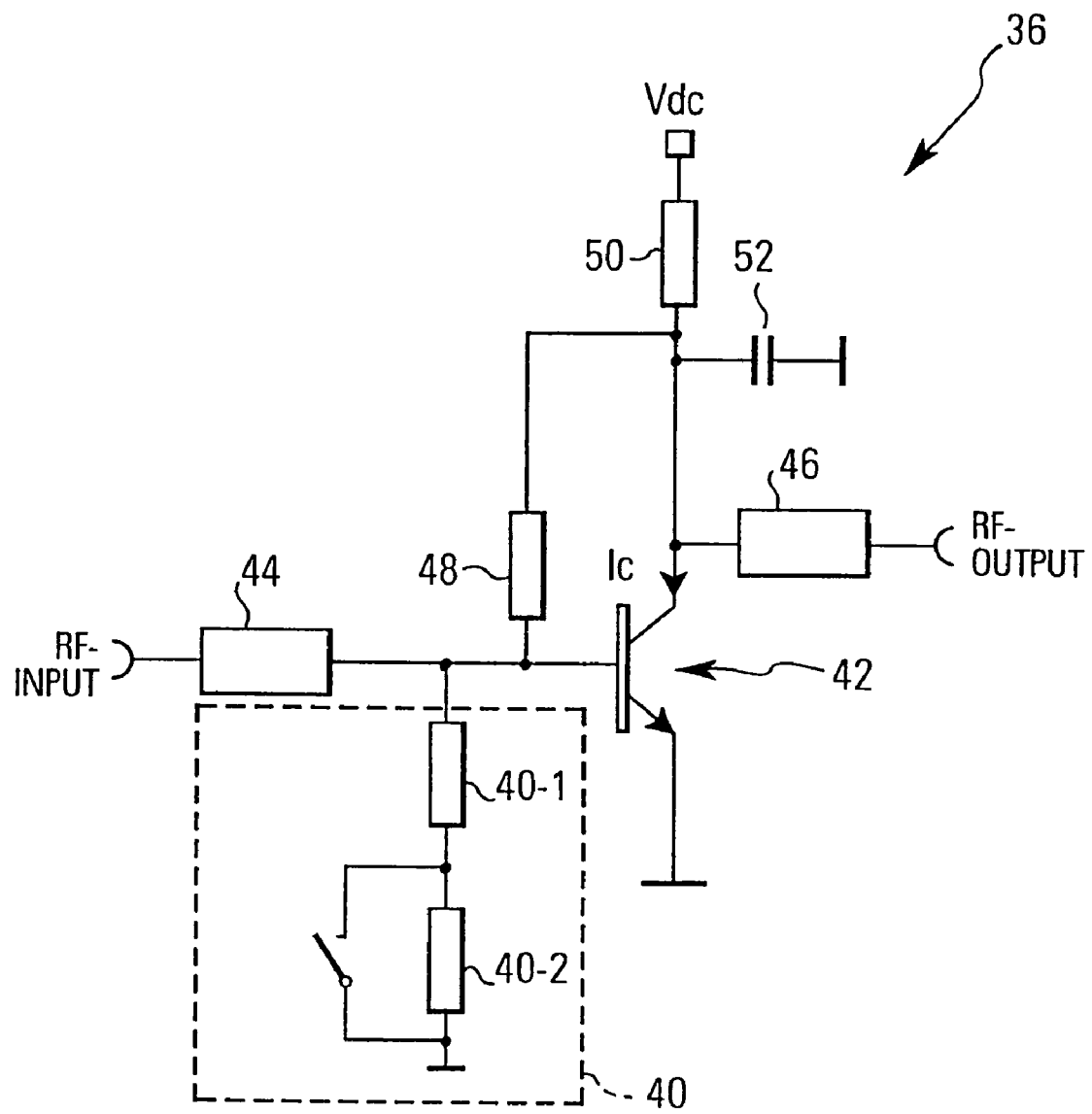
FIG. 8 shows a schematic diagram of a low noise amplifier having a tunable matching network and an operating point setting network according to the present invention.

FIG. 8 shows the basic structure of the low noise amplifier 36 enabling an operation mode modification.

As shown in FIG. 8, the low noise amplifier 36 comprises a switchable bias network 40 adapted to define at least two biasing conditions of the amplification element or equivalently the amplifying transistor 42 in the low noise amplifier. In addition, the low noise amplifier 36 comprises a switchable matching network 44 adapted to optimize noise performance, gain and stability of the low noise amplifier at the different bias conditions determined by the switchable bias network 40.

Also, there may be provided an additional matching network 46 at the output side for improved matching of the low noise amplifier 36 to the subsequent filter 38, i.e. the input impedance thereof. Additional resistors 48 and 50 are provided to further determine the operation point of the amplifying transistor 42. Also, a capacitor 52 is provided as decoupling capacitor achieving a short circuit of RF frequencies at the output side.

The low noise amplifier shown in FIG. 8 is operated with at least two biasing conditions. Here, a first biasing condition is related to a normal operation mode to optimize noise performance and achieve low current consumption in the first subunit 12 when no transmit bursts are generated by the second subunit 14. Also, a second biasing condition is related to a gain adjustment mode to improve blocking performance when transmit bursts are generated by the second subunit 14.

Therefore, one option to modify the operation mode is to change the bias operation point in the switchable bias network 40 for the amplifying transistor 42. Of course, this has an impact on the noise figure of the lower noise amplifier 36 since the S-parameter of the amplifying transistor 42 changes with changing collector current and hence the matching network 44 adapted for optimal noise can be changed as well. In other words, the matching network 44 and optionally the matching network 46 provided for optimum noise performance, gain and stability according to the present invention are switchable to provide well defined operative conditions for the at least two different biasing conditions outlined above.

According to the present invention the operation mode modification means 34 shown in FIG. 7 employs at least one signal received from the second subunit 14 to activate the normal operation mode of the lower noise amplifier 36 in the first subunit 12. This at least one signal is selected from a group comprising:

at least a signal indicating receiver operation in the second subunit 14;

a signal to select frequency band and mode for reception in the second subunit 14;

at least one signal containing base band information of the received signal at the second subunit 14;

at least one signal being used to set a specific divider ratio for reception at the second subunit 14; and at least one positioning system S/N measurement signal indicating a decreased S/N ratio and thus the transmitting operation of the second subunit 14.

Alternatively, the second gain adjustment mode in the low noise amplifier 36 of the first subunit 12 may be defined according to control and/or input signals defined in the transmitter signal of the second subunit 14. Here, the at least one control signal is selected from a group comprising:

a control signal indicating transmitter operation in the second subunit 14;

a control signal to activate the antenna switch in the transmitter of the second subunit 14;

a control signal to select frequency band or mode in the second subunit 14;

a control signal to set ramping up and power level of a power amplifier in the second subunit 14; and control signals that are used to set a transmitter specific divider ratio.

Still further, the at least one input signal to set the gain adjustment mode in the first subunit 12 is selected from a group comprising:

input signals containing base band information for transmission through the second subunit 14;

a local oscillator input signal in a transmit/receive chain of the second subunit 14;

transceiver transmitter signals detected by an RF-detector, e.g., attached in the surrounding of the second antenna 32;

interfering RF-signals received by the antenna 28 of the first subunit 12 and detected through a further detector (not shown in FIG. 7).

As shown in FIG. 7, each of the different signals, i.e. at least one signal to actuate the normal operation mode of the gain adjustment mode in the first subunit 12 is transferred from the second subunit 14 by a connection between the second subunit 14 and the first subunit 12, in particular the second subunit 14 and the operation mode modification unit 34.

In the following, a more detailed explanation of the matching network to be used in the low noise amplifier shown in FIG. 8 will be given with respect to FIG. 9.

Figure 9:
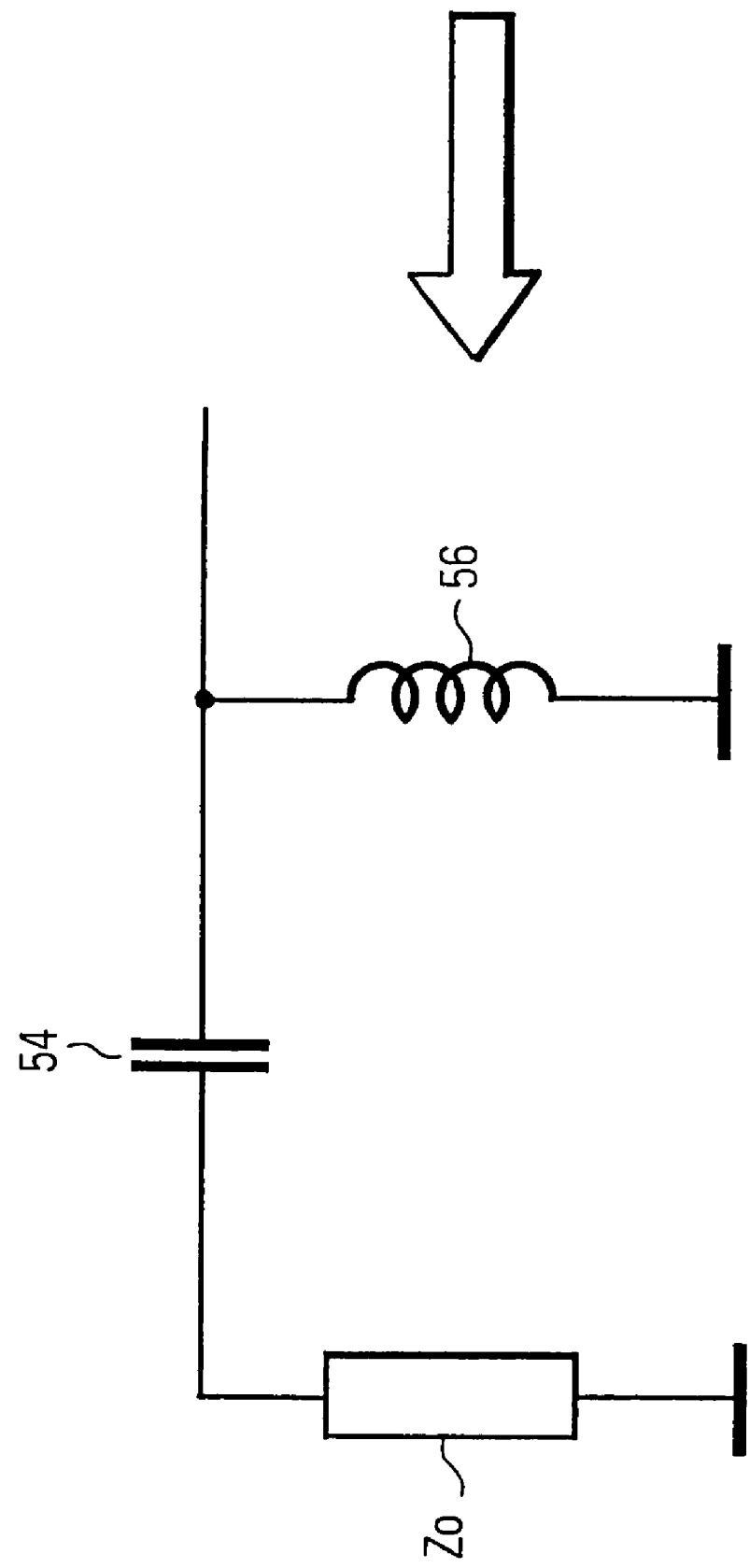
FIG. 9 shows a schematic diagram of a matching network to be used in the low noise amplifier shown in FIG. 8.

The matching network shown in FIG. 9 serves to achieve optimum noise matching, i.e. to provide a resistance according to the overall system impedance, e.g., 50 Ω, at its input terminal. Heretofore, it is necessary to derive a device model that has an input impedance equivalent to the complex conjugate Zopt* of the optimum noise impedance Zopt. Since the design of impedance matching network is well known in the art, no further details will be explained here, but reference is made, e.g., to microwave field effect transistor—Theory, Design and Application; R. S. Pengelly; Electronic Devices and Systems Research Studies; 1982; ISBM 0471 102083, pp. 163. Typical examples for the matching network 44 at the amplification transistor 42 input terminals for an amplifying bipolar transistor of the BFP405 type for Zo=System Impedance ==50 Ohm;

Gopt Source reflection coefficient for minimum noise figure;
f=1.8 GHz;
VCE=1 V;

are as follows:

| Input reflection coefficient transistor BFP405 as a function of collector current | | | | Matching network | |
|---|---|---|---|---|---|
| IC mA | Fmin[ ] | Gopt_mag[ ] | Gopt_ang [deg] | C1 [pF] | L1 [nH] |
| 1.0 | 1.15 | 0.56 | 32 | 1.33 | 7.00 |
| 2.5 | 1.20 | 0.41 | 25 | 1.77 | 7.46 |
| 5.0 | 1.43 | 0.28 | 17 | 2.33 | 8.47 |

Figure 10:
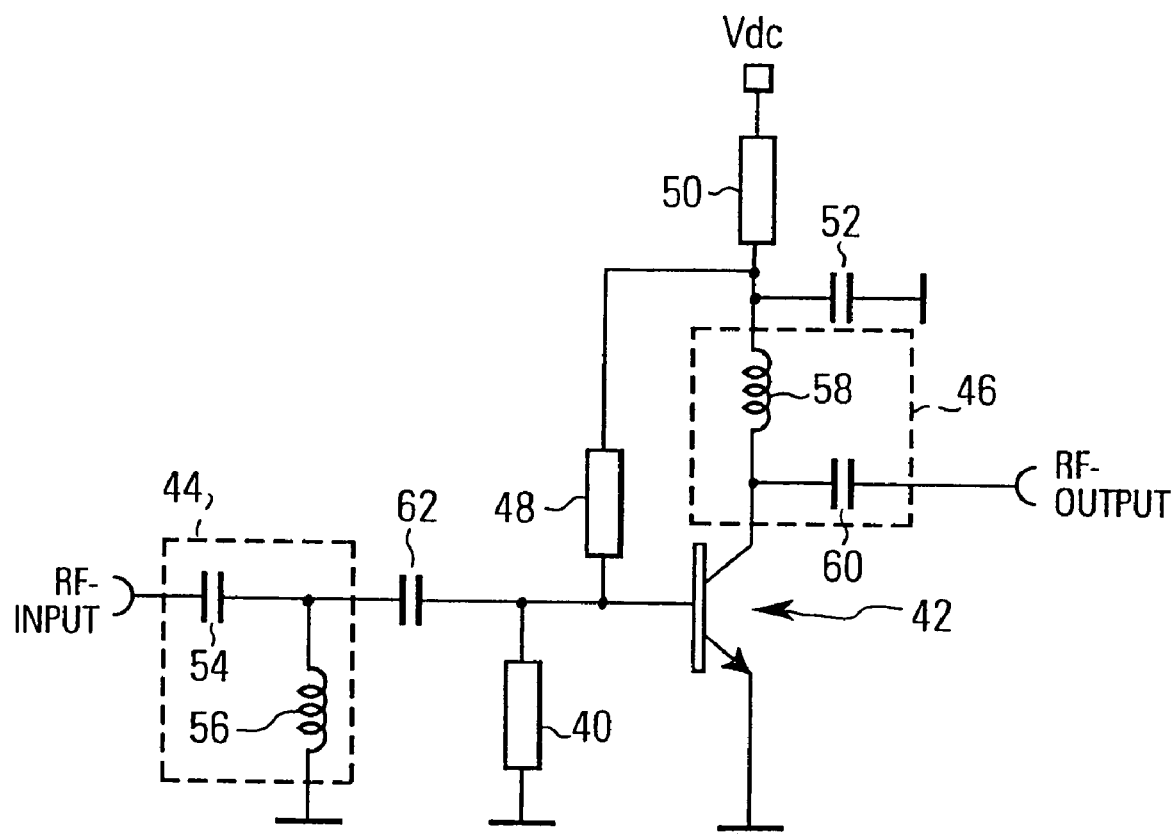
FIG. 10 shows a schematic diagram of the low noise amplifier including the matching network shown in FIG. 9.

FIG. 10 shows a further detailed schematic diagram of the low noise amplifier 36 of the first subunit 12 shown in FIG. 7 comprising the matching network shown in FIG. 9.

In particular, the matching network shown in FIG. 9 is inserted for the matching network 44 and 46 shown in FIG. 8. While the matching network 46 at the output side shown in FIG. 8 is implemented also using the matching network shown in FIG. 9, different reference numerals have been assigned to the related capacitor and inductor, since the capacitance and inductance for the matching network 44 at the input side and the matching network 46 at the output side according to the present invention must not be identical. Also, a further decoupling capacitor 46 is provided between the input matching network 44 and the variable biasing transistor 40 so as to achieve a short circuit of RF components.

Operatively, in the low noise amplifier shown in FIG. 10 the RF input signal from the antenna is passed over the input matching network 44 to achieve optimal noise matching. Further, the signal occuring at the output of the input matching network 44 is then passed over the capacitor 62 short-circuiting radio frequencies and it then controls the amplifying transistor 42. Further, the biaspoint settings are defined by the values of the resistors 40, 48 and 50.

However, it should be noted that the present invention is not restricted to this biapoint setting but that otherwise point setting schemes may easily be found, e.g., in: U. Tietze, Ch. Schenk: Halbleiter-Schaltungstechnik; Springer Verlag; ISBN 3-540-16720-X, pp. 49: "4.3.5 Arbeitspunkteinstellung". As shown in FIG. 8 above, the biapoint can be made variable by using tunable resistors. For example, resistor 40 may be split into two resistors 40-1 and 40-2. Resistor 40-2 may then be short-circuited by a switch such that in case the switch is closed the total value of resistor 40 takes a smaller value when being compared to the state when the switch connected across the resistor 40-2 is kept open.

Further, in the low noise amplifier circuit shown in FIG. 10 the collector current Ic may easily be controlled through change of the supply voltage Vdc. Here, typical values are IC=1.5 mA at Vbat=Vdc=3.4 V, Ic=2.5 mA at Vbat=Vdc=5 V, and Ic=4.5 mA at Vbat=Vdc=8.2 V.

While in the above the operative modes of the low noise amplifier according to the present invention has been considered, another aspect is the exact time of switching of the input characteristics of the low noise amplifier. In particular, in case the first subunit 12 receives a localization signal such as a GPS-signal, it should be considered that the localization information is comprised in the phase of the reception signal. Therefore, another aspect of the present invention is the time of operation mode modification for the first subunit 12. Preferably, this occurs at a prespecified time—e.g., 100 $\mu$sec to 150 $\mu$sec—before the output of the transmission burst by the second subunit 14, e.g., through use of a delayed signal for the switch-on of transmitter-relevant functional blocks which is typically used to activate the antenna switch. Therefore, this modification allows to avoid in advance any disturbance of phase-related information to be received by the first subunit 12.

While in the above specific measures with respect to the low noise amplifier or the first subunit 12 have been described with respect to FIGS. 8 to 10, in the following further options to avoid a disturbing interference between different subunits in a multiple standard communication device will be explained with respect to FIGS. 11 to 13.

Figure 11:
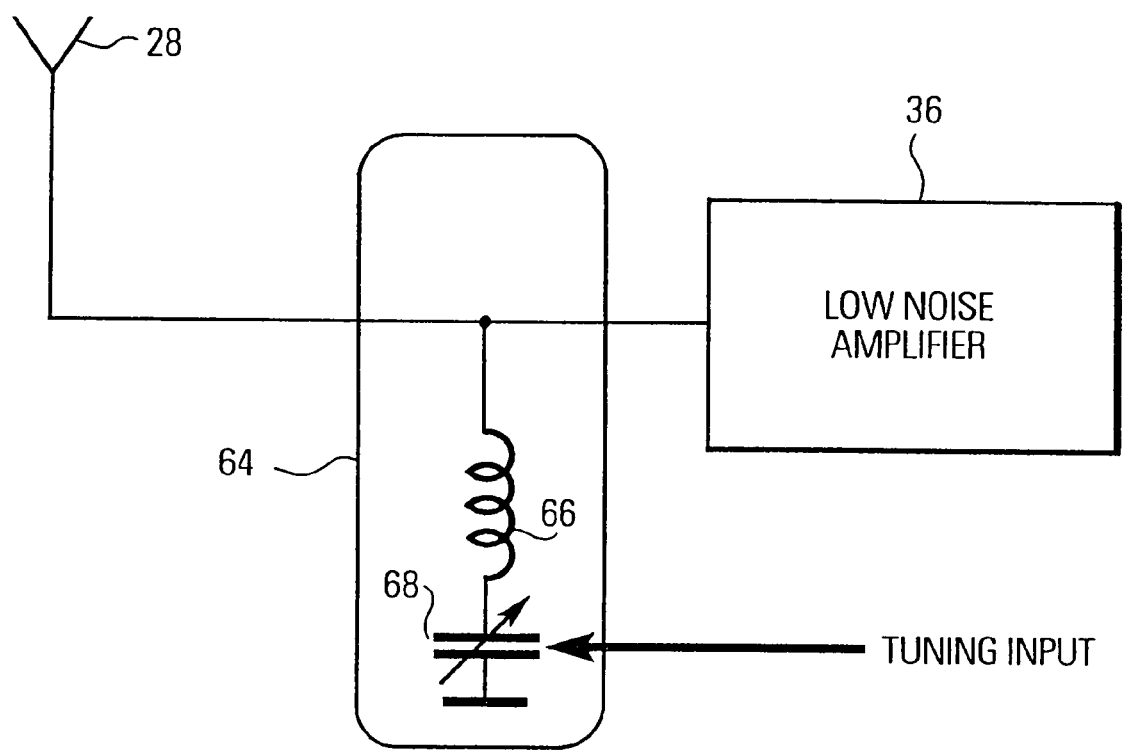
FIG. 11 shows a schematic diagram of a tunable filter provided between the antenna and the low noise amplifier of the first subunit.

FIG. 11 shows a schematic diagram of a tunable filter being provided between the antenna 28 and the low noise amplifier 36 of the first subunit 12 shown in FIG. 7. The tunable filter 64 shown in FIG. 11 comprises an inductor 66 and a variable capacitor 68 and may be tuned to achieve a stop band attenuation towards interference signals from the second subunit 14.

Operatively, the tunable filter 64 in front of the low noise amplifier 36 is tunable in terms of filter bandwidth and cut-off frequency under control of appropriate signals as listed above either continuously or in discrete steps in order to give smallest insertion loss or highest stop band attenuation.

E.g., operatively a notch filter may be placed in front of the low noise amplifier 36 and be tuned to the transmit frequency of the second subunit 14 such that a maximum stop band attenuation is achieved at the interfering frequency. Since the interfering signal and the received signal are close in the frequency domain, the insertion loss of the pass band of the notch filter 64 may be significant due to the limited Q factor of the filter.

However, the insertion loss of the tunable filter 64 may be minimized when the interfering signal is not present so that the center frequency of the tunable filter 64 may be detuned in order to increase the distance to the wanted reception signal. In dependence on the required attenuation one tuning state may be sufficient to, e.g., attenuate all interfering frequencies in one complete interfering band such as, e.g., GSM900=25 MHz.

The notch filter 64 shown in FIG. 11 may comprise suitable tuning elements such as varicaps or pin diodes 68 as variable network elements. Further, low/high bandpass filters may be designed as tunable filters 64 in a similar way as described for notch filters. Further, matching networks consisting of inductors/capacitors and used for impedance transformation may be considered as tunable filters as well.

Figure 12:
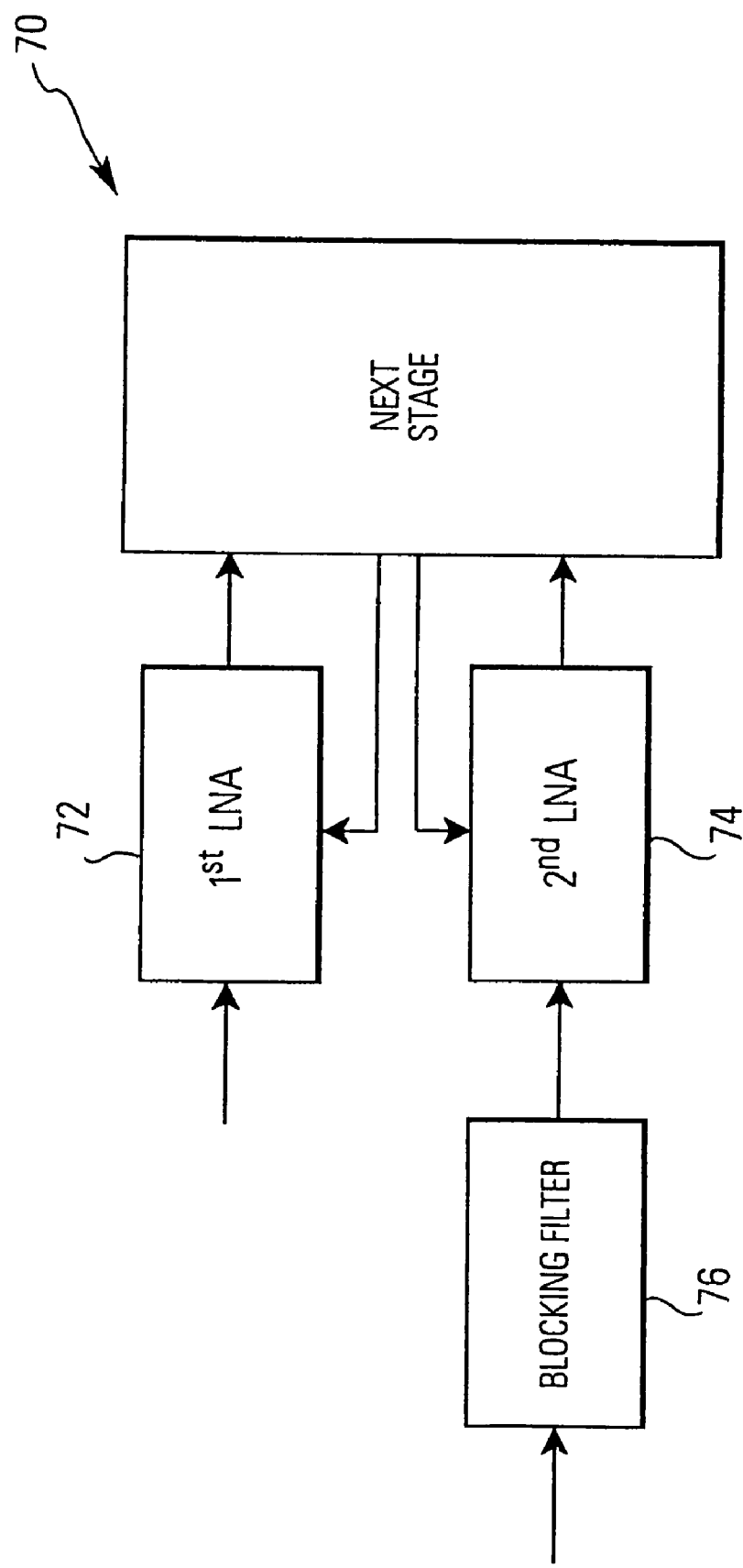
FIG. 12 shows a schematic diagram of a switchable receiver.

FIG. 12 shows a schematic diagram of the switchable receiver 70 as another option to modify the operation mode of the first subunit 12 shown in FIG. 7 in dependence on the transmission mode in the second subunit 14 in accordance with the present invention.

As shown in FIG. 12, the switchable receiver comprises a first low noise amplifier 72 that is directly connected to an antenna. The first low noise amplifier 32 is adapted to receive, e.g., a positioning system localization signal and to amplify the positioning system localization signal. This localization signal may be a signal of the GPS type. Nevertheless, the present invention is not restricted to the GPS localization system and any other standard, e.g., the GLONASS or EGNOSS, WAAS standard may be used as well.

As also shown in FIG. 12, the switchable receiver 70 comprises a second low noise amplifier 74 which also amplifies the positioning system localization signal. Also, at the input terminal of the second low noise amplifier 74 there is provided a filter 76 between the antenna and the second low noise amplifier 74 that is adapted to reject interfering signals.

Operatively, in the switchable receiver shown in FIG. 12 the second low noise amplifier 74 with a pre-connected tunable filter 76 is activated in case the performance of the first low noise amplifier 72 is limited due to interfering signals from a neighbouring subunit. Therefore, in case no interfering signals prevail, no switchable filter is required for the first low noise amplifier 72 which therefore may be directly connected to the antenna. In other words, the insertion loss due to an additional filter may be avoided as long as no interfering signals prevail at the antenna and only in case a pre-filtering is necessary such an insertion loss is accepted.

Figure 13:
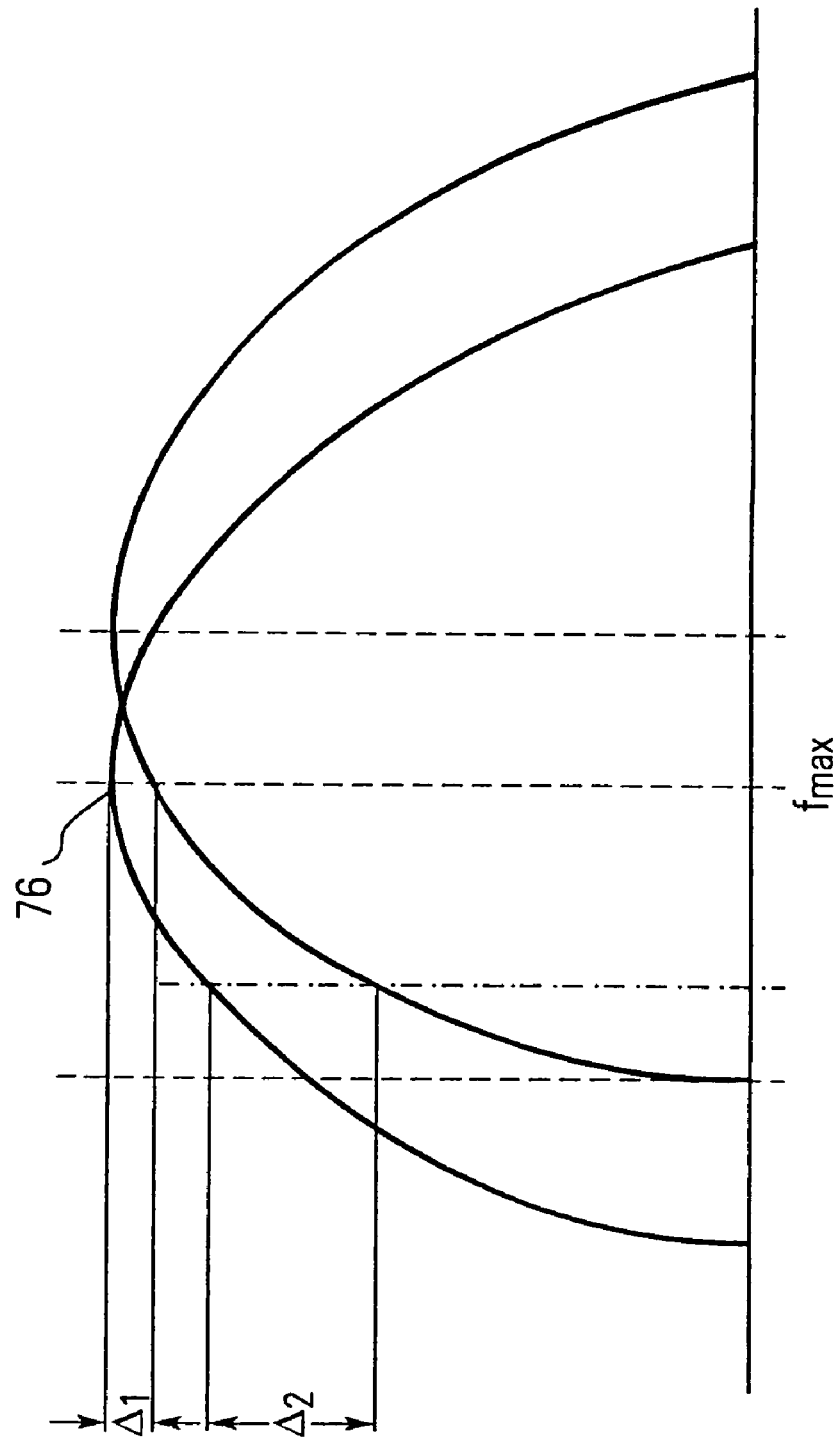
FIG. 13 shows an adaptation of antenna characteristics to enhance out of band blocking performance.

FIG. 13 shows another embodiment of the present invention, i.e. the adaptation of the antenna characteristics of the antenna 28 of the first subunit 12 to enhance the blocking performance in case the transmitter of the second subunit 14 outputs transmission bursts.

As shown in FIG. 13, according to this aspect of the present invention the antenna characteristics are adapted such that the blocking performance of the first subunit 12 is enhanced by shifting the gain characteristic 76 to the right in case of an interfering signal. While such a shift to the right leads to a slight decrease of the $\Delta_1$ for the attenuation at the maximum frequency, a much higher attenuation of $\Delta 2$ may be achieved for out-of-band signals thus enabling a much improved blocking performance.

Therefore, according to the present invention use is made of the fact that generally antennas—e.g. GPS antennas—are designed to achieve the highest gain at the center frequency over the interesting frequency band, i.e. GPS: Smax=1575 MHz±1 MHz CA. Through the provision of the tunable antenna, maximum antenna gain may still be achieved if no interfering signal is present. On the other hand, in case of presence of an interfering signal out of band rejection is improved at a slight expense of antenna gain at the desired maximum frequency.

FIG. 14 shows an illustration of a GPS/GSM multiple standard communication device according to the present invention.

As shown on FIG. 14 on the left side, the transmitting subunit 30 may be the usual GMS mobile phone having the antenna 32. Further, the first subunit 12 adapted to receive GPS signals for localization may be provided as extra unit 26 which preferably is provided with a patch antenna 28 for the reception of the signals for localization.

As also shown in FIG. 14, a coupling between the GSM mobile phone and the GPS receiver unit may be achieved via an additional connector 78.

As also shown in FIG. 14, the GPS receiver unit 26 may as well be provided on top of the GSM mobile phone 30 in case the longitudinal space available for the overall multiple standard communication device is restricted. Here, e.g., the patch antenna 28 is placed in a flip in front of the mobile phone.

In the above, specific embodiments of the present invention have been described. It is to be understood for the person skilled in the art that the different features outlined and discussed above may be used not only as discussed with respect to different embodiments but also be combined in any meaningful and useful way. In particular, the different measurements may be well combined so as to achieve an even increased blocking behaviour against the different signals within a multiple standard communication device. Further, any variations and modifications, e.g., of the matching network and the operative point setting network are to be construed to be comprised by the present invention the scope of which is only defined by the dependent claims.

ABBREVIATIONS

AMPS Advanced mobile phone service
GPS Global Positioning System, 1575 MHz
LNA Low noise amplifier
NF Noise figure
G Gain
GSM900 GSM standard, 890 MHz–960 MHz
GSM1800 GSM standard, 1710 MHz–1880 MHz
GSM1900 GSM standard, 1850 MHz–1990 MHz

What is claimed is:

1. A multiple standard communication device of the type with parallel operation, comprising:
    a first subunit at least adapted to receive input signals at a predetermined input level in a first receiving mode dedicated to optimum noise performance;
    a second subunit at least adapted to transmit output signals at a specific time, frequency and output level such that the output level is very large compared to the input level of said first subunit; and
    an operation mode modification unit adapted to modify the operation mode of the first subunit from the first receiving mode to a second receiving mode when the second subunit is transmitting output signals, the second receiving mode being dedicated to optimum blocking performance.

2. The multiple standard communication device of claim 1, wherein the operation mode modification unit is adapted to receive at least one signal specifying at least one of time, frequency, and output level in the second subunit for operation mode modification in the first subunit.

3. The multiple standard communication device of claim 1, wherein the operation mode modification unit is adapted to modify the receiving mode of the first subunit through a low noise amplifier having at least one of at least two operation modes, a tunable filter, a switchable receiver, and an antenna with tunable gain.

4. The multiple standard communication device of claim 3, wherein the low noise amplifier has at least two operation modes and comprises:
    a switchable bias network adapted to define at least two biasing conditions of said low noise amplifier; and
    a switchable matching network adapted to optimize noise performance, gain and stability of the low noise amplifier for the at least two biasing conditions;
    wherein a first biasing condition is related to a normal operation mode to optimize noise performance and achieve low current consumption in the first subunit when no transmit bursts are generated by the second subunit; and
    wherein a second biasing condition is related to a gain adjustment mode to improve blocking performance when transmit bursts are generated by the second subunit.

5. The multiple standard communication device of claim 4, wherein the operation mode modification unit is adapted to employ at least one signal to activate the normal operation mode, the at least one signal comprises at least one of:
    at least a signal indicating receiver operation;
    a signal to select frequency band and mode;
    at least one signal containing baseband information of the received signal;

at least one signal being used to set a specific divider ratio; and at least one positioning system S/N measurement signal.

6. The multiple standard communication device of claim 4, wherein at least one of control signals and input signals defining a transmitter signal of the second subunit are employed to activate the gain adjustment mode.

7. The multiple standard communication device of claim 6, wherein at least one control signal comprises at least one of:
   a control signal indicating transmitter operation;
   a control signal adapted to activate an antenna switch in the transmitter;
   a control signal to select frequency band or mode;
   a control signal to set a ramping and power level of a power amplifier; and
   a control signals that are used to set a transmitter specific divider ratio.

8. The multiple standard communication device of claim 6, wherein the at least one input signal comprises at least one of:
   at least one input signal including baseband information for transmission;
   a local oscillator input signal in a transmit/receive chain;
   at least one transceiver transmitter signal detected by an RF detector;
   at least one interfering RF-signal received by an antenna of the first subunit and detected through a further detector.

9. The multiple standard communication device of claim 4, wherein the switchable matching network is adapted to define the at least two biasing conditions for an amplification element of the low noise amplifier.

10. The multiple standard communication device of claim 5, wherein the tunable filter is adapted to block the interference signal only when transmit bursts are generated by the second subunit.

11. The multiple standard communication device of claim 3, wherein the switchable receiver comprises:
   a first low noise amplifier being directly connected to an antenna adapted to receive a signal for localization and to amplify the position system localization signal;
   a second low noise amplifier adapted to amplify the signal for localization; and
   a filter connected between the antenna and the second low noise amplifier and adapted to reject blocking signals; and
   wherein in case the performance of the first low noise amplifier is limited due to an interfering signal, the second low noise amplifier with the filter connected thereto is activated.

12. The multiple standard communication device of claim 3, wherein antenna characteristics are adapted to enhance blocking performance of the first subunit for shifting the frequency with maximum gain in case the presence of a blocking signal so as to provide additional attenuation for out of band signals.

13. The multiple standard communication device of claim 1, wherein the first subunit is a global positioning system (GPS) receiver and the second subunit outputs two transmission signals according to the dual band mobile communication standard GSM 900/GSM 1900.

14. A multiple standard communication device of the type with parallel operation, comprising:
   a first subunit at least receiving input signals at a predetermined input level;
   a second subunit at least transmitting output signals at a specific time, frequency and output level such that said output level is very large compared to said input level of said first subunit;
   wherein an operation mode of said first subunit is modified when said second subunit is transmitting output signals;
   said first subunit comprises an operation mode modification unit to receive at least one signal specifying at least one of time, frequency, and output level in said second subunit for operation mode modification in said first subunit;
   said operation mode modification unit is adapted to modify an input characteristic of said first subunit;
   said input characteristic of said first subunit is modified through a low noise amplifier having at least one of at least two operation modes, a tunable filter, a switchable receiver, and an antenna with tunable gain;
   said low noise amplifier has at least two operation modes and comprises:
      a switchable bias network adapted to define at least two biasing conditions of said low noise amplifier;
      a switchable matching network is adapted to optimize noise performance, gain and stability of said low noise amplifier for said at least two biasing conditions; and
      wherein a first biasing condition is related to a normal operation mode to optimize noise performance and achieve low current consumption in said first subunit when no transmit bursts are generated by said second subunit;
   a second biasing condition is related to a gain adjustment mode to improve blocking performance when transmit bursts are generated by said second subunit; and
   said switchable matching network is adapted to define said at least two biasing conditions for an amplification element of said low noise amplifier.

15. The multiple standard communication device of claim 14, wherein said operation mode modification unit employs at least one signal to activate said normal operation mode, and wherein said at least one signal comprises at least one of:
   at least a signal indicating receiver operation;
   a signal to select frequency band and mode;
   at least one signal including baseband information of said received signal;
   at least one signal being used to set a specific divider ratio; and
   at least one positioning system SIN measurement signal.

16. The multiple standard communication device of claim 14, wherein at least one of control signals and input signals defining a transmitter signal of said second subunit are employed to activate said gain adjustment mode.

17. The multiple standard communication device of claim 16, wherein said at least one control signal comprises at least one of:
   a control signal indicating transmitter operation;
   a control signal adapted to activate an antenna switch in said transmitter;
   a control signal to select frequency band or mode;
   a control signal to set a ramping and power level of a power amplifier; and
   at least one control signal that is used to set a transmitter specific divider ratio.

18. The multiple standard communication device of claim 16, wherein said at least one input signal comprises at least one of:
- at least one input signal including baseband information for transmission;
- a local oscillator input signal in a transmit/receive chain;
- at least one transceiver transmitter signal detected by an RF-detector;
- at least one interfering RF-signal received by an antenna of said first subunit and detected through a further detector.

19. A multiple standard communication device of the type with parallel operation, comprising:
- a first subunit at least receiving input signals at a predetermined input level;
- a second subunit at least transmitting output signals at a specific time, frequency and output level such that said output level is very large compared to said input level of said first subunit;
- wherein an operation mode of said first subunit is modified when said second subunit is transmitting output signals;
- wherein said first subunit comprises an operation mode modification unit to receive at least one signal specifying at least one of time, frequency, and output level in said second subunit for operation mode modification in said first subunit, said operation mode modification unit adapted to modify an input characteristic of said first subunit;
- wherein said input characteristic of said first subunit is modified through a low noise amplifier having at least one of at least two operation modes, a tunable filter, a switchable receiver, and an antenna with tunable gain; and
- wherein said switchable matching network is adapted to define said at least two biasing conditions for an amplification element of said low noise amplifier or said tunable filter is adapted to block said interference signal only when transmit bursts are generated by said second subunit.

20. A multiple standard communication device of the type with parallel operation, comprising:
- a first subunit at least receiving input signals at a predetermined input level;
- a second subunit at least transmitting output signals at a specific time, frequency and output level such that said output level is very large compared to said input level of said first subunit;
- wherein an operation mode of said first subunit is modified when said second subunit is transmitting output signals;
- wherein said first subunit comprises an operation mode modification unit to receive at least one signal specifying at least one of time, frequency, and output level in said second subunit for operation mode modification in said first subunit, said operation mode modification unit adapted to modify an input characteristic of said first subunit, said input characteristic of said first subunit is modified through a low noise amplifier having at least one of at least two operation modes, a tunable filter, a switchable receiver, and an antenna with tunable gain; and
- wherein said switchable receiver comprises:
  - a first low noise amplifier being directly connected to an antenna adapted to receive a signal for localization and to amplify the position system localization signal;
  - a second low noise amplifier adapted to amplify the signal for localization; and
  - a filter connected between said antenna and said second low noise amplifier and adapted to reject blocking signals, and wherein in case a performance of said low noise amplifier is limited due to an interfering signal said second low noise amplifier with said filter connected thereto is activated.

21. The multiple standard communication device of claim 20, wherein said low noise amplifier has at least two operation modes and comprises:
- a switchable bias network adapted to define at least two biasing conditions of said low noise amplifier; and
- a switchable matching network is adapted to optimize noise performance, gain and stability of said low noise amplifier for said at least two biasing conditions;
- wherein a first biasing condition is related to a normal operation mode to optimize noise performance and achieve low current consumption in said first subunit when no transmit bursts are generated by said second subunit; and
- wherein a second biasing condition is related to a gain adjustment mode to improve blocking performance when transmit bursts are generated by said second subunit.

22. The multiple standard communication device of claim 21, wherein said operation mode modification unit employs at least one signal to activate said normal operation mode, said at least one signal comprises at least one of:
- at least a signal indicating receiver operation;
- a signal to select frequency band and mode;
- at least one signal containing baseband information of said received signal;
- at least one signal being used to set a specific divider ratio; and
- at least one positioning system S/N measurement signal.

23. The multiple standard communication device of claim 21, wherein at least one of control signals and input signals defining a transmitter signal of said second subunit are employed to activate said gain adjustment mode.

24. The multiple standard communication device of claim 21, wherein said at least one control signal comprises at least one of:
- a control signal indicating transmitter operation;
- a control signal adapted to activate an antenna in said transmitter;
- a control signal to select frequency band or mode;
- a control signal to set a ramping and power level of a power amplifier; and
- at least one control signal used to set a transmitter specific divider ratio.

25. The multiple standard communication device of claim 23, wherein said at least one input signal comprises at least one of:
- at least one input signal including baseband information for transmission;
- a local oscillator input signal in a transmit/receive chain;
- at least one transceiver transmitter signal detected by an RF-detector;
- at least one interfering RF-signal received by an antenna of said first subunit and detected through a further detector.

26. The multiple standard communication device of claim 24, wherein said at least one input signal comprises at least one of:
- at least one input signal including baseband information for transmission;

a local oscillator input signal in a transmit/receive chain;
transceiver transmitter signals detected by an RF-detector;
at least one interfering RF-signal received by an antenna of said first subunit and detected through a further detector.

27. A method of operating a multiple standard communication device of the type with parallel operation, comprising a first subunit at least receiving input signals at a predetermined input level in a first receiving mode dedicated to optimum noise performance and a second subunit at least transmitting output signals at a specific time, frequency and output level such that the output level of the second subunit is very large compared to the input level of the first subunit, comprising the step of:
modifying an operation mode of the first subunit from the first receiving mode to a second receiving mode when the second subunit is transmitting output signals, the second receiving mode being dedicated to optimum blocking performance.

28. The method of claim 27, wherein the operation mode of the first subunit is modified in compliance with at least one of time, frequency, and output level in the transmitting second subunit.

29. The method of claim 28 wherein an input characteristic of the first subunit is modified via a low noise amplifier having at least one of at least two operation modes, a tunable filter, a switchable receiver, and a tunable antenna gain.

30. The method of claim 29, wherein operation mode modification is executed using at least one signal to activate a normal operation mode in the second subunit.

31. The method of claim 29, wherein at least one of control signals and input signals defining a transmitter signal in the second subunit are employed to initiate the operation mod modification in the first subunit.

32. A computer program product directly loadable into an internal memory of a digital computer, comprising software code portions for performing a method of operating a multiple standard communication device of the type with parallel operation, comprising a first subunit at least receiving input signals at a predetermined input level in a first receiving mode dedicated to optimum noise performance and a second subunit at least transmitting output signals at a specific time, frequency and output level such that the output level of the second subunit is very large compared to the input level of the first subunit, with a step of:
modifying the operation mode of the first subunit from the first receiving mode to a second receiving mode when the second subunit is transmitting output signals when the computer program product is run on a computer, the second receiving mode being dedicated to optimum blocking performance.

33. The computer program product of claim 32 which is stored on a computer storage medium.

* * * * *

UNITED STATES PATENT AND TRADEMARK OFFICE
CERTIFICATE OF CORRECTION

| | | |
|---|---|---|
| PATENT NO. | : 7,010,270 B1 | |
| APPLICATION NO. | : 09/637543 | |
| DATED | : March 7, 2006 | |
| INVENTOR(S) | : Thomas et al. | |

It is certified that error appears in the above-identified patent and that said Letters Patent is hereby corrected as shown below:

In Column 1, Lines 36-37, delete "communcation" and insert -- communication --, therefor.

In Column 1, Line 49, delete "communcation" and insert -- communication --, therefor.

In Column 2, Line 7, delete "sensitiviy" and insert -- sensitivity --, therefor.

In Column 2, Line 57, delete "amplication" and insert -- amplification --, therefor.

In Column 2, Line 63, delete "consumtion" and insert -- consumption --, therefor.

In Column 3, Line 15, delete "reveived" and insert -- received --, therefor.

In Column 3, Line 22, delete "interferring" and insert -- interfering --, therefor.

In Column 3, Line 28, delete "interferring" and insert -- interfering --, therefor.

In Column 4, Lines 36-37, delete "constanly" and insert -- constantly --, therefor.

In Column 4, Line 37, delete "desireable" and insert -- desirable --, therefor.

In Column 4, Line 53, delete "communcation" and insert -- communication --, therefor.

In Column 6, Line 18, delete "adaquate" and insert -- adequate --, therefor.

In Column 6, Line 40, delete "interferring" and insert -- interfering --, therefor.

In Column 7, Line 23. delete "amlipifer/" and insert -- amplifier/ --, therefor.

In Column 7, Line 67, delete "interferring" and insert -- interfering --, therefor.

In Column 8, Line 2, delete "interferring" and insert -- interfering --, therefor.

In Column 11, Line 1, after "Gopt" insert -- = --.

In Column 11, Line 35, delete "occuring" and insert -- occurring --, therefor.

UNITED STATES PATENT AND TRADEMARK OFFICE
CERTIFICATE OF CORRECTION

PATENT NO. : 7,010,270 B1
APPLICATION NO. : 09/637543
DATED : March 7, 2006
INVENTOR(S) : Thomas et al.

It is certified that error appears in the above-identified patent and that said Letters Patent is hereby corrected as shown below:

In Column 20, Line 7, in Claim 31, delete "mod" and insert -- mode --, therefor.

Signed and Sealed this

Twentieth Day of November, 2007

JON W. DUDAS
*Director of the United States Patent and Trademark Office*